United States Patent [19]

Gorres et al.

[11] 4,149,265
[45] Apr. 10, 1979

[54] METHOD OF IMPROVING THE OPERATION OF A SINGLE WALL DOMAIN MEMORY SYSTEM

[75] Inventors: John M. Gorres, Cottage Grove; Marlin M. Hanson, Cologne; Roger E. Lund, Woodbury, all of Minn.

[73] Assignee: Sperry Rand Corporation, New York, N.Y.

[21] Appl. No.: 786,317

[22] Filed: Apr. 11, 1977

[51] Int. Cl.² ............................................. G11C 19/08
[52] U.S. Cl. ........................................... 365/2; 365/10; 365/37; 365/235
[58] Field of Search ...................... 340/174 TF, 174 S; 365/2, 10, 19, 37, 235

[56] References Cited

U.S. PATENT DOCUMENTS

| | | | |
|---|---|---|---|
| 3,715,736 | 2/1973 | O'Donnell et al. | 365/37 |
| 3,913,079 | 10/1975 | Rosier | 340/174 TF |
| 3,953,842 | 4/1976 | Hu et al. | 340/174 TF |
| 4,012,724 | 3/1977 | Hanson et al. | 340/174 TF |

*Primary Examiner*—James W. Moffitt

*Attorney, Agent, or Firm*—Kenneth T. Grace; William E. Cleaver; Marshall M. Truex

[57] ABSTRACT

A method of and an apparatus for improving the selective positioning of single wall domains or bubble domains in a bubble domain memory system is disclosed. The method includes the use of slotted intersecting digit and word drive lines that form memory areas, each memory area being defined by the inside opposing edges of the slotted drive lines at each intersection. Each memory area has four quadrants, three of which are effectively optically blocked by an opaque shield—a bubble domain in the one unblocked quadrant provides the desired Faraday rotation of a plane polarized coherent light beam to generate a beamlet that is optically detected as a binary digital signal. The slotted drive lines are formed below the surface of the bubble domain supporting layer whereby the so-provided magneto static barriers prevent bubble domain sticking in a selected one quadrant of the four quadrants of the memory area and prevent bubble domain escape from the memory area itself.

3 Claims, 5 Drawing Figures

METHOD OF IMPROVING THE OPERATION OF A SINGLE WALL DOMAIN MEMORY SYSTEM

BACKGROUND OF THE INVENTION

In the Marlin M. Hanson, et al, U.S. Pat. No. 4,012,724 there is disclosed an optical page composer that is comprised of a magnetizable film layer in which single wall domains or bubble domains may be sustained and moved about and to which are inductively coupled a slotted digit drive line and perpendicular slotted word drive line, the intersection of which forms four quadrants that define or are defined by a memory area in the bubble domain supporting layer. An opaque shield is oriented in the memory area for optically shielding a bubble domain except when in the first quadrant within the memory area. Coincident current selection, e.g., concurrent half-current selection, of the digit drive line and of the word drive line by half-select signals of the proper polarity permits the one fully selected memory area to be selected for the selective writing of a "1" or of a "0" therein, e.g., the associated bubble domain is selectively positioned on either the first or the third quadrants.

The optical page composer is preferably comprised of a magnetizable film layer of, e.g., garnet, having orthogonal sets of parallel slotted digit drive lines and parallel slotted word drive lines, each intersection of which forms four quadrants that define or are defined by an associated memory area with an opaque shield oriented in three of the four quadrants of each memory area. In the operation of such page composer, as during the writing or transferring operation, it has been observed that the bubble domains, under certain operating conditions, may escape from their proper stable conditions, e.g., the first quadrant, within the memory area, or, alternatively, may become "stuck" in one stable position and may not be selectively positioned from one stable position, e.g., the first quadrant into another stable position, e.g., the third quadrant. The present invention is directed toward a method of ensuring the reliable operation of such Marlin M. Hanson, et al, U.S. Pat. No. 4,012,724 including forming the slotted drive lines within, e.g., ion milled channels that are formed in the surface of the bubble domain supporting layer.

SUMMARY OF THE INVENTION

In the hereinabove referenced Marlin M. Hanson, et al, U.S. Pat. No. 4,012,724, bubble sticking within and bubble escape from the memory area are obviated by the incorporation of relatively high magnetizable layers of, e.g., cobalt that are located beneath the slotted digit and word drive lines. The high magnetic retentivity of the cobalt layers provides static, external magnetic fields that are oriented antiparallel, inwardly toward the memory area. These inwardly directed static magnetic fields repel bubble domains positioned within the memory area away from the inside edges of the slotted drive lines toward the longitudinal center line of the intersecting slotted drive lines such that the cobalt layers function as magnetostatic barriers to bubble domains within the memory area. These static magnetic fields provide the desired magnetic effects to provide an improved bubble domain memory system operation. However, the fabrication of such structure is difficult to achieve in an economical manner. The present invention provides a more simplified apparatus that achieves the same end result, i.e., prevents bubble domain sticking in and escaping from a memory area defined by two intersecting slotted drive lines. In the present invention, the slotted drive lines are formed below the surface of the bubble domain supporting layer in, e.g., ion milled channels such that the edges of the channels, which edges define the periphery of the memory area, provided a magnetostatic barrier to the bubble domains within the memory area.

DESCRIPTION OF THE PREFERRED EMBODIMENTS

Figure 1:
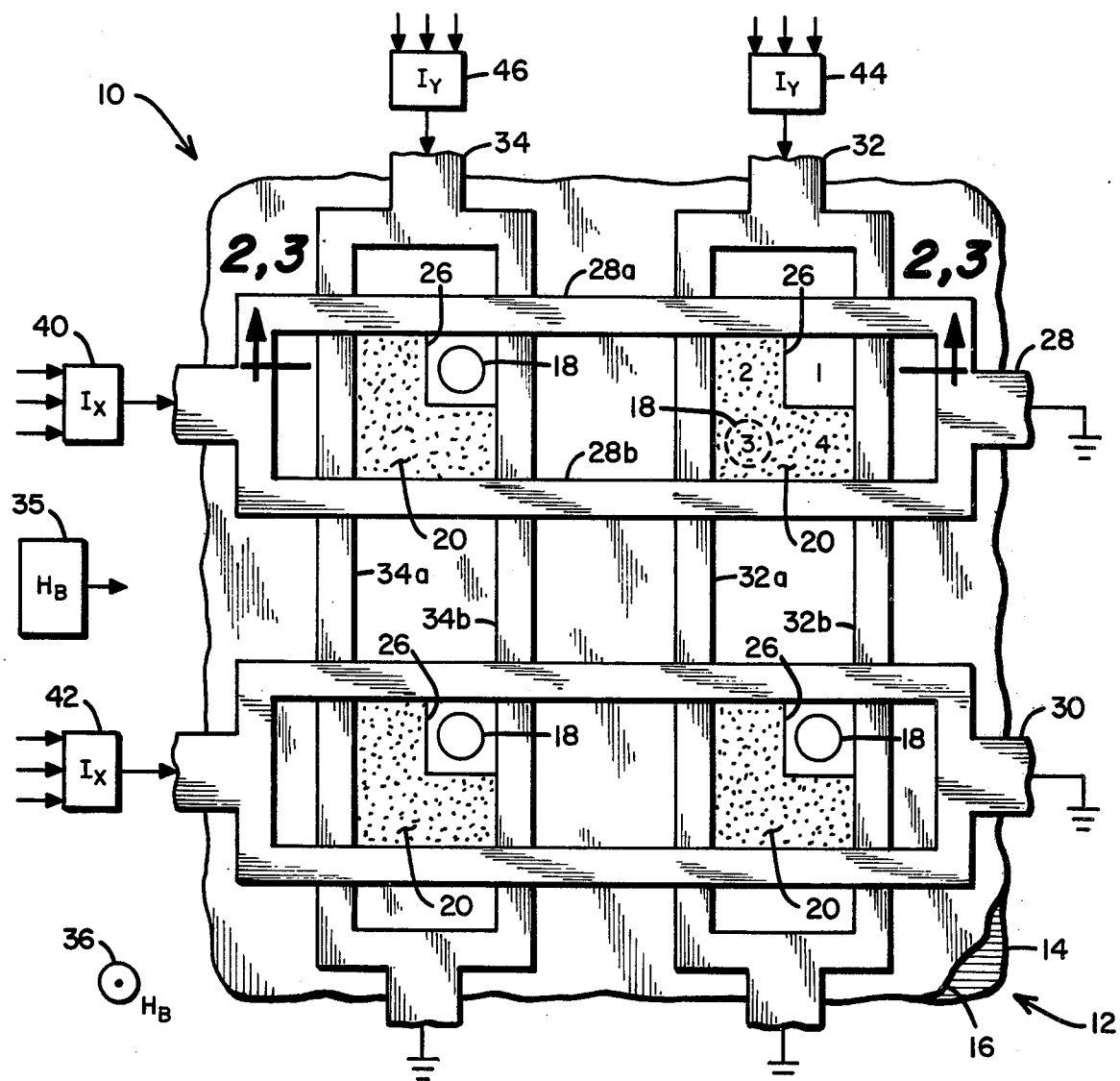
FIG. 1 is a block diagram of a bubble domain memory system incorporating the present invention.
Figure 2:
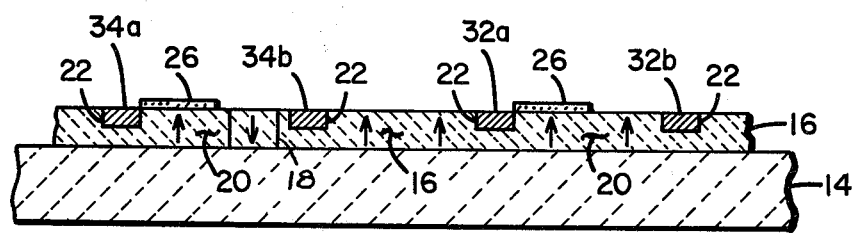
FIG. 2 is a cross-sectional view of a first embodiment of the memory plane of FIG. 1 taken along line 2—2 thereof.

With particular reference to FIG. 1 there is presented a block diagram of the bubble domain memory system 10 incorporating the present invention. System 10 includes a memory plane 12 which is a laminated, integral structure the layers of which are preferably formed by the liquid phase epitaxy (LPE) method. With particular reference to FIG. 2 there is presented an illustration of a cross section of a memory plane 12 in FIG. 1 taken along line 2—2 thereof for providing an illustration of the first embodiment of the present invention, while with particular reference to FIG. 3 there is presented an illustration of a cross section of a memory plane 12 of FIG. 1 taken along line 3—3 thereof for the purpose of illustrating a second embodiment of the present invention.

FIG. 2 illustrates that memory plane 12 is comprised of a plurality of stacked, superposed layers preferable integrally formed by the liquid phase epitaxial method and is comprised of a non-magnetic garnet support layer 14 of Gadolinium Gallium Garnet (GGG) of approximately 80 microns ($\mu$m) in thickness upon which is formed a bubble domain layer 16 of a magnetizable material of 5-10 $\mu$m in thickness in which a plurality of bubble domains 18 may be generated, sustained and moved about. In both the first and second embodiments of FIGS. 2 and 3, there is formed upon substrate layer 14 a plurality of, e.g., square, confinement or memory areas 20, which are formed from the bubble domain supporting magnetizale layer 16. Each of the confinement areas 20 is of a thickness to support the bubble domain 18 and whose side dimension is of a length that is substantially larger than that of the bubble domain 18 that would normally be supported by layer 16. In the first embodiment of FIG. 2, the confinement areas 20 are formed from the continuous layer 16 by, e.g., an ion milling technique of the plurality of fixed channels 22 in the top surface thereof—see the publication "Microstructure Arrays Produced By Ion Milling", E. G. Spencer, et al, Journal Of Applied Physics, Volume 17, No. 8, 15 October 1970, pp. 328-332—or any of other various techniques, such as chemical etching. Sufficient material, in the area of channels 22, is removed from the top surface of layer 16 so as to reduce the remaining portion of layer 16 to a thickness that (a) along the edge of confinement area 20 produces a spatially periodic magnetic field $H_p$, normal to the plane of layer 16, that is of sufficient intensity to repel bubble domains 18 within confinement area 20 away from the edge of confinement area 20 or (b) is insufficient to support bubble domains therein. In the second embodiment of FIG. 3, in contrast, layer 16, except in the area of confinement areas 20, is entirely removed from the top surface of support layer 14, as by the method that is used to produce the first embodiment of FIG. 2.

Figure 3:
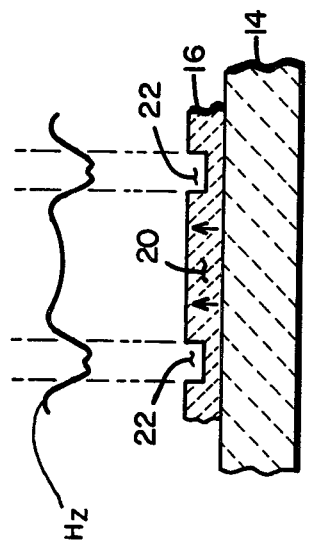
FIG. 3 is a cross-sectional view of a second embodiment of the memory plane of FIG. 1 taken along line 3—3 thereof.

In both the first and second embodiments of FIGS. 2 and 3, there are formed along the edges of the confinement areas 20, as in the channels 22 of FIG. 2, a matrix array of the parallel set of horizontally oriented X drive lines 28, 30 and an orthogonally oriented parallel set of Y drive lines 32, 34. Such X and Y drive lines are slotted, having the associated strip lines 28a, 28b of X drive line 28 and strip lines 32a, 32b of Y drive line 32. The intersections of such X and Y drive lines, e.g., X and Y drive lines 28 and 32, respectively, as at the inside opposing edges of their respectively associated strip lines 28a, 28b and 32a, 32b, respectively, define the respectively associated confinement or memory area 20 which confinement areas 20 define four quadrants, four corner oriented ones of which are illustrated in each of the memory areas 20 of FIG. 1 as quadrants 1, 2, 3 and 4. Additionally, positioned with each of confinement areas 20 is an opaque layer 26 which, except in the area of quadrant 1, effectively optically blocks any light beams incident to the planar surface thereof. This configuration is similar to that of the hereinabove referenced Marlin M. Hanson, et al, U.S. Pat. No. 4,012,724.

Figure 4:
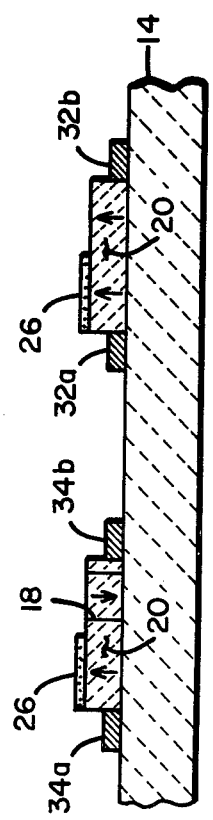
FIG. 4 is an illustration of a cross section of the memory plane of FIG. 1 and the resulting normal field $H_Z$.

With particular reference to FIG. 4 there is presented a portion of the cross section of the first embodiment of FIG. 2 and associated therewith a plot of the field $H_Z$ that is directed normal to the plane of memory plane 12 and that is the resultant field of the field $H_p$ that is generated by the ion milled channels 22 formed in the top surface of bubble domain supporting magnetizable layer 16 and of the field $H_B$ that is generated by $H_B$ source 35, i.e., $$H_Z = H_B + H_p.$$

FIG. 4 illustrates that the perpendicular field $H_Z$, which has the same waveform as does field $H_p$, is at a relative minimum level at the center of the confinement area 20 defined by the two channels 22 with a relatively higher intensity field near the periphery of the confinement area 20 as defined by the inside opposing edges of the channels 22. It is this increase of intensity of the perpendicular field $H_Z$ near the edges of the confinement areas 20 that provides the repelling force to a bubble domain 18 oriented therein which prevents bubble sticking and bubble escaping, the theory of which is discussed in the hereinabove referenced Marlin M. Hanson, et al, U.S. Pat. No. 4,012,724.

Figure 5:
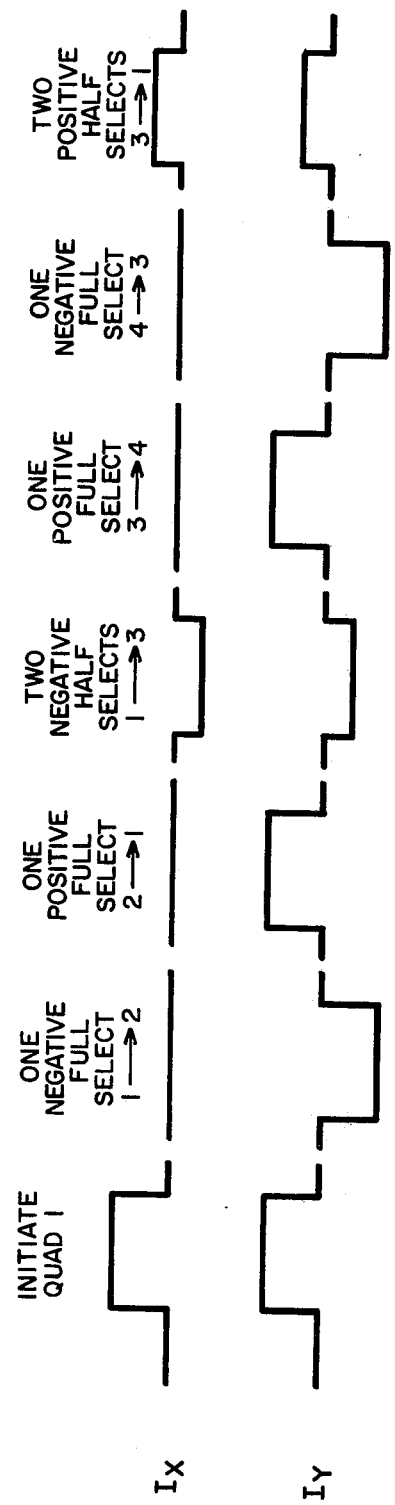
FIG. 5 is an illustration of the waveforms of the drive field signals that are utilized by the system of FIG. 1.

With particular reference to FIG. 5 there is presented an illustration of the timing and waveform relationships of the drive signals that are associated with the operation of the bubble domain memory system 10 of FIG. 1. Provided by bias field $H_B$ source 35 is a bias field $H_B$, as represented by the dot and concentric circle 36, which implies a field directed normal to the plane of the layer 16 of magnetizable material in which bubble domains 18 may be sustained and moved about—such bias field $H_B$ may be provided by a configuration of Helmheltz coils such as illustrated in the A. H. Bobeck Patent, U.S. Pat. No. 3,534,347. Using digit drivers 40, 42 as sources for the drive current signal $I_X$ and word drivers 44, 46 as sources for the drive current signal $I_Y$, a bubble domain 18 may be transferred from any one corner of memory or confinement areas 20, as denoted by quadrants 1, 2, 3, 4 to any other quadrant within confinement area 20 as defined by the intersecting slot of the slotted X drive lines 28, 30 and the slotted Y drive lines 32, 34, respectively, when energized by the judicious use of half-select and full-select drive current signals, all as illustrated in FIG. 5.

Accordingly, it can be seen that the present invention provides a novel means of structuring the positions of a plurality of bubble domains within the bubble domain memory plane in a predetermined and predictable manner. By using the perpendicular, i.e., normal to the plane of layer 16, field $H_p$ that is generated by the thickness gradient as provided by the, e.g., ion milled channel 22 of FIG. 2 to generate a static repelling magnetic field at the periphery of the memory area, the problems of bubble sticking and bubble escaping from the memory area are substantially eliminated while concurrently providing an apparatus of simplified structure.

What is claimed is:

1. In a bubble domain memory system including a planar layer of mangetizable material in which bubble domains may be generated, sustained and moved between first, second, third and fourth stable positions in a memory area in said layer, which stable positions are within a memory area that is defined by the inside opposing edges of intersecting first and second inductively coupled slotted strip lines, by drive current signals that are coupled to said layer by said slotted strip lines, in the method of preventing said bubble domains from escaping from the magnetomotive effect of said drive current signals to transfer said bubble domains between said first, second, third and fourth stable positions, the improvement comprising:

removing a portion of the surface of said layer along the periphery of said memory area;

defining a confinement area of said memory area by said removed surface portion;

forming a thickness gradient along the periphery of said confinement area by said removed surface portion;

forming said slotted strip lines within said removed surface portion and along said thickness gradient; and generating a field $H_p$, which field $H_p$ is oriented normal to the plane of said layer, by and along said thickness gradient for forming a magnetostatic barrier to a bubble domain that is within said confinement area.

2. In a bubble domain memory system including a planar layer of a magnetizable material in which bubble domains may be generated, sustained and moved between first, second, third and fourth stable positions in a memory area in said layer, which stable positions are within a memory area that is defined by the inside opposing edges of intersecting first and second inductively coupled slotted strip lines, by drive current signals that are coupled to said layer by said slotted strip lines, in the method of preventing said bubble domains from escaping from the magnetomotive effect of said drive current signals to transfer said bubble domain between said first, second, third and fourth stable positions, the improvement comprising:

forming orthogonally oriented sets of parallel pairs of channels in said layer;

forming the pairs of lines of each of said slotted strip lines in said parallel pairs of channels;

forming thickness gradients along the inside edges of the intersecting orthogonally oriented sets of parallel pairs of channels for defining confinement areas; and, generating a field $H_p$, which field $H_p$ is oriented normal to the plane of said layer by and along said thickness gradients, for forming a magnetostatic barrier to a bubble domain within each of said confinement areas.

3. A bubble domain memory plane comprising:

a non-magnetizable substrate;

a split X drive line;

a split Y drive line insulatively superposed said split X drive line and orthogonally oriented with respect thereto;

a bubble domain layer superposed said substrate whose peripheral edges are defined by the opposing inside edges of said split X and Y drive lines; and, a thickness gradient, defined by the peripheral edges of said layer, generating a field $H_p$, which field $H_p$ is oriented normal to the plane of said layer, for forming along said thickness gradient a magnetostatic barrier to a bubble domain that is within said bubble domain layer.

* * * * *